United States Patent [19]

Tanbakuchi

[11] Patent Number: 5,465,417
[45] Date of Patent: Nov. 7, 1995

[54] INTEGRATED BARIUM-FERRITE TUNED MIXER FOR SPECTRUM ANALYSIS TO 60 GHZ

[75] Inventor: Hassan Tanbakuchi, Santa Rosa, Calif.

[73] Assignee: Hewlett-Packard Company, Palo Alto, Calif.

[21] Appl. No.: 168,886

[22] Filed: Dec. 16, 1993

[51] Int. Cl.$^6$ ..................................................... H04B 1/26
[52] U.S. Cl. ......................... 455/330; 455/326; 455/327; 333/26; 333/235
[58] Field of Search ................................. 455/326, 327, 455/330, 333, 329, 328, 323, 325; 333/26, 205, 223, 235

[56] References Cited

U.S. PATENT DOCUMENTS

| | | | |
|---|---|---|---|
| 3,839,677 | 10/1974 | Sedin | 455/326 |
| 4,607,394 | 8/1986 | Nightingale | 455/327 |
| 4,704,739 | 11/1987 | Murakami et al. | 455/327 |

*Primary Examiner*—Edward F. Urban
*Assistant Examiner*—Doris To
*Attorney, Agent, or Firm*—William C. Milks, III

[57] ABSTRACT

A routing barium-ferrite tuned resonator filter integrated with an image-enhanced, single-balanced mixer. The barium-ferrite tuned resonator filter is preferably a four-sphere barium-ferrite tuned preselector which is integrated with a harmonically mixed, image-enhanced, single-balanced mixer to provide a high level of dynamic range in a harmonically mixed front end. An input resonator of the preselector in combination with a dual PIN diode switch switches low-frequency input signals (e.g., 0 to 26.5 GHz) to a low-frequency output. For high-frequency input signals (e.g., 26.5 to 50 GHz), the four-sphere barium-ferrite tuned preselector is combined with the image-enhanced, single-balanced mixer which incorporates a GaAs monolithic diode bridge integrated circuit. This provides a front end component of a high-performance portable spectrum analyzer.

20 Claims, 11 Drawing Sheets

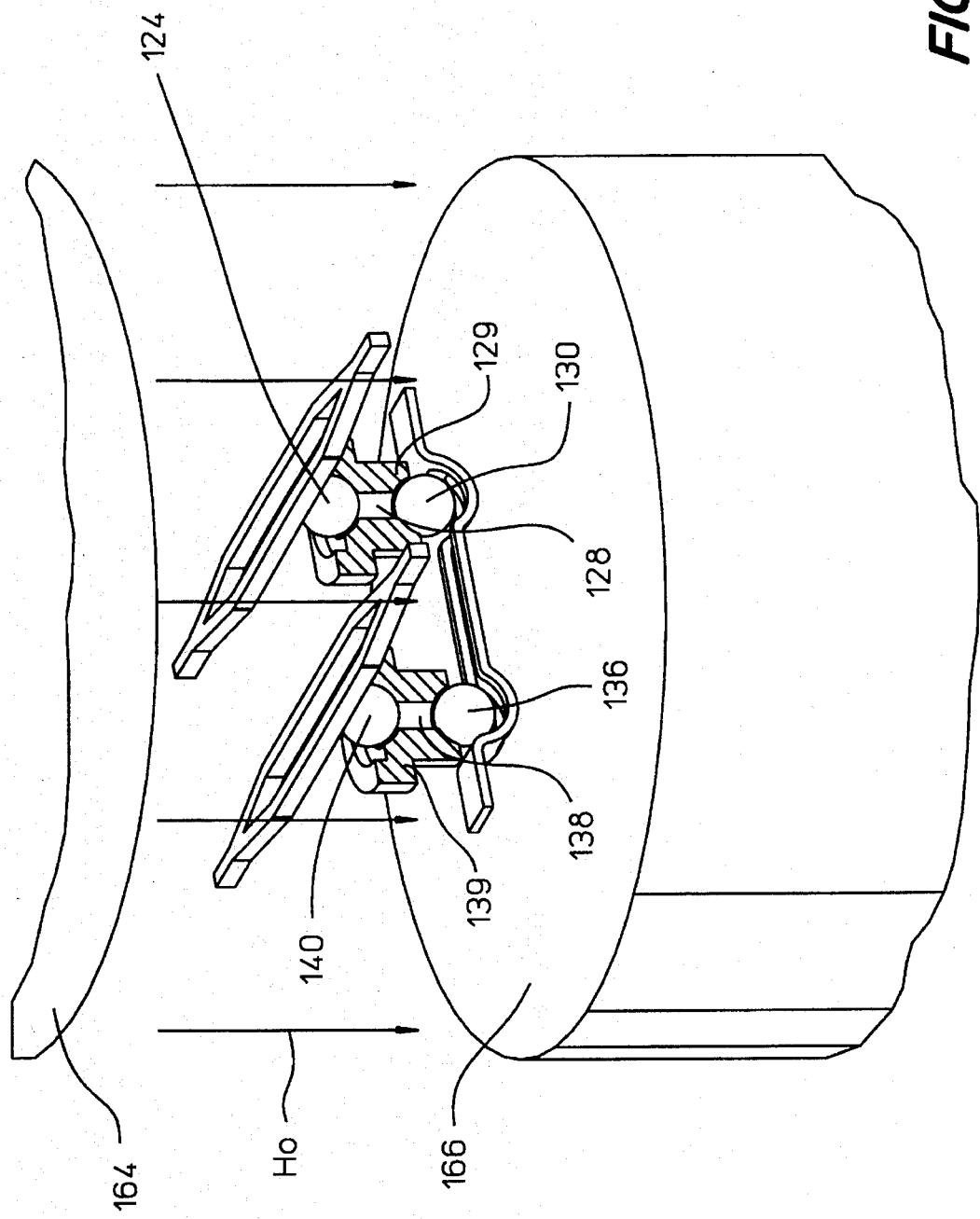

INTEGRATED BARIUM-FERRITE TUNED MIXER FOR SPECTRUM ANALYSIS TO 60 GHZ

BACKGROUND OF THE INVENTION

This invention relates to electronic instruments for detecting and/or measuring electrical signals and, more particularly, to electronic instruments for detecting and/or measuring the frequency spectrum of electrical signals. Specifically, one embodiment of the invention provides an integrated barium-ferrite tuned mixer particularly adaptable for use in an electronic instrument known as a spectrum analyzer. In one implementation, the mixer is preferably an even harmonic mixer which employs second harmonic mixing at frequencies from 26.5 to 31 GHz and fourth harmonic mixing at frequencies from 31 to 50 GHz. The mixer in accordance with one embodiment of the invention can also be combined with at least one additional barium-ferrite tuned resonator to form a barium-ferrite tuned resonator filter and mixer that allows for tuning over the frequency range of approximately 26.5 to 50 GHz.

Generally, a spectrum analyzer is a scanning receiver that displays power and modulation characteristics of electrical input signals over a selected frequency band. To cover a broad frequency range, e.g., from approximately 0 to 40 GHz, an input signal is typically divided into low-frequency and high-frequency portions. In this regard, the input signal is preferably effectively routed between low- and high-frequency signal processing sections of the spectrum analyzer depending upon the frequency of the input signal.

Accordingly, FIG. 1 shows a block diagram illustrating a superheterodyne receiver which forms the initial signal processing circuit of a conventional spectrum analyzer. Initially, all input signals, e.g., signals in the frequency range from approximately 0, e.g., 30 Hz, to 40 GHz, applied to an input 11, e.g., a coaxial connection, pass through a step attenuator 12 and are directed to a diplexer 13 which selectively routes the input signals to the low-frequency signal processing section on line 14 or to the high-frequency signal processing section on line 15.

On the one hand, low-frequency input signals, e.g., input signals having a frequency under 26.5 GHz, are applied to a low-frequency signal processing section of the spectrum analyzer. Input signals from approximately 0 to 26.5 GHz are diplexed to a front end 16, e.g., an HP 8563E spectrum analyzer available from Hewlett-Packard Company, Palo Alto, Calif., connected to a swept, yttrium-iron-garnet (YIG) tuned local oscillator (LO) 18 for spectrum analysis. Such a low-frequency signal processing section is disclosed in copending U.S. Patent application Ser. No. 08/094,833 entitled ROUTING YIG-TUNED MIXER filed on Jul. 20, 1993, in the name of Hassan Tanbakuchi and assigned to the same assignee as this patent application, the disclosure of which is hereby incorporated herein in its entirety by this reference.

On the other hand, high-frequency input signals, e.g., RF (millimeter) input signals having a frequency greater than 26.5 GHz, e.g., 26.5 to 40 GHz, are passed through a tunable bandpass filter 21. The passed RF input signal is then passed through a fixed attenuator 22 (e.g., a 6 dB attenuator) and downconverted by a harmonic mixer 23. The harmonic mixer 23 preferably combines the RF input signal with a signal 5produced by the LO 18, or a harmonic of the signal from the LO, to produce a predetermined IF output signal at a frequency, e.g., 321.4 MHz, suitable for further processing by the high-frequency analysis circuit (not shown) of the spectrum analyzer.

Considered in more detail, a spectrum analysis measurement is performed on a high-frequency input signal by sweeping the LO signal frequency over the frequency range of interest, while the predetermined IF frequency is monitored. The graph in FIG. 2 illustrates the result of the down conversion by the harmonic mixer 23 shown in FIG. 1, evidencing the relationship between the LO, RF, and predetermined IF frequencies. In FIG. 2, the vertical axis represents signal power, and the horizontal axis represents signal frequency. The predetermined IF signal 25 has a frequency equal to the difference between the LO signal (or harmonic) 27 and the RF input signal 29, so that the RF input signal is measured by monitoring a set IF frequency, below the LO signal frequency, at $f_{RF}=(n)f_{LO}-f_{IF}$. However, an image RF signal above the LO signal frequency, at $f_{RF}=(n)f_{LO}+f_{IF}$, will also produce a signal at the monitored IF frequency. To resolve this ambiguity, the tunable bandpass filter 21 shown in FIG. 1 acts as a tunable bandpass filter over a frequency range including $f_{RF}$, as shown by the broken line curve 31 that appears in FIG. 2, thereby attenuating any image signal 33 at $f'_{RF}$. Therefore, the passband of the tunable bandpass filter 21 shown in FIG. 1 must track the sweeping LO signal, with the center frequency of the passband separated from the LO frequency (or harmonic) by the IF signal frequency.

The tunable bandpass filter 21 shown in FIG. 1 is essential to eliminate unwanted mixing products from being displayed on the spectrum analyzer. Ferrimagnetic materials, such as YIG and barium-ferrite, are predominately used as magnetically tunable resonators for broadband (multi-decade) tunable filters. Filtering is accomplished by magnetically coupling RF signals to a spherical magnetic resonator. By placing the spherical magnetic resonator within the pole gap of an adjustable electromagnet, the tuned frequency of the resonator can be controlled. The ferrimagnetic resonance frequency for a spherical magnetic resonator is:

$$f_r = \gamma (H_0 \pm H_a),$$

where $H_0$ is the strength of the externally applied DC magnetic field produced by the electromagnet in ocrsteals, $H_a$ is the internal anisotropy field (in oersteds) within the ferrimagnetic material, and $\gamma$ is the gyromagnetic ratio (2.8 MHz/oersted).

The tunable bandpass filter 21 shown in FIG. 1 can be a YIG-tuned resonator filter, or preselector, which comprises a YIG sphere suspended between two orthogonal half loop conductors with the YIG sphere centered on the intersection of the loop axes. When the YIG sphere is not magnetized, an RF input signal is not transferred between the half loops, because there is no interaction between the RF input signal and the YIG sphere and the loops are perpendicular to each other. However, in the presence of an externally applied DC magnetic field produced by the electromagnet along an axis perpendicular to the half loops, the dipoles in the YIG sphere align with the DC magnetic field, producing a strong net magnetization, M, in the YIG sphere. An RF input signal applied to the input half loop therefore produces an alternating RF magnetic field perpendicular to the externally applied DC magnetic field, which causes the dipoles in the YIG sphere to precess around the DC magnetic field at the frequency of the RF input signal. The precession frequency is equal to the frequency of the RF input signal if the RF input signal frequency equals or closely approximates the dipole resonance frequency of the spherical YIG resonator.

That is, if an RF input signal at or near $f_r$ is applied to the input half loop, the YIG material exhibits ferrimagnetic resonance, such that the precessing dipoles create a circularly polarized magnetic field, rotating at the RF input signal frequency, in a plane perpendicular to the externally applied DC magnetic field. This rotating magnetic field couples to the output half loop, including an RF signal in the output half loop that, at the resonance frequency $f_r$, is phase-shifted 90° from the RF input signal.

The YIG-tuned resonator filter therefore acts as a gyrator. The phase shift in one direction through the YIG-tuned resonator filter differs from the phase shift in the other direction by 180°. The filtering function is achieved because RF input signals deviating from the dipole resonance frequency by more than a small amount do not couple to the YIG sphere.

Because the resonance bandwidth can be made fairly narrow, the YIG resonator comprises a highly selective bandpass filter at RF frequencies, tunable by varying the strength of the externally applied DC magnetic field. Typical loaded Q values for YIG-tuned resonator filters range from 100 to 400.

On the one hand, YIG has traditionally been used as the ferrimagnetic material in tunable bandpass filters which operate up to 30 GHz. Moreover, YIG has been used as high as 40 GHz with some degradation in insertion loss and off-resonance isolation. There are, however, severe limitations in using YIG above 40 GHz. First, YIG has a relatively low saturation magnetization (i.e., <1,750 Gauss). As a result, loop coupling is the only efficient topology to couple to a YIG sphere resonator at such high frequencies. However, designing a coupling loop with self-resonance frequencies above 40 GHz would require very small geometries, including sphere diameters less than 0.2 mm. Since the loop coupling coefficient is proportional to sphere volume and inversely proportional to the area enclosed by the coupling loop, smaller geometries decrease coupling coefficients (i.e., increase filter insertion loss) and decrease the filter bandwidth.

A second limitation in using YIG beyond 40 GHz is its small internal anisotropy field, $H_a$, of about 100 to 200 oersteds. As the above equation demonstrates, a high magnetic field (e.g., >10,000 oersteds) is required to tune YIG to frequencies beyond 30 GHz. This translates to problems with high power dissipation and magnetic saturation in the electromagnet.

On the other hand, barium-ferrite has been used effectively as the ferrimagnetic material in loop coupled tunable bandpass filters covering the frequency range of 26.5 to 40 GHz. Barium-ferrite has been successfully grown with an internal anisotropy field ranging from 7,500 to 15,000 oersteds depending upon doping. With a higher internal anisotropy field than YIG, barium-ferrite filters can be constructed with less stringent requirements on the electromagnet. For example, the same magnetic field needed to tune a YIG resonator to 28 GHz would tune a barium-ferrite resonator with $H_a$=8,400 oersteds to 50 GHz, thereby covering the frequency range of 26.5 to 50 GHz. However, loop coupling to barium-ferrite is not suitable beyond 40 GHz due to loop self-resonance.

Also, barium-ferrite tunable bandpass filters are known operating from 26.5 to 75 GHz in waveguide bands. For example, waveguide-to-sphere plus iris coupling have been used to construct waveguide barium-ferrite tunable bandpass filters. See U.S. Pat. No. 4,888,569. While performance of such tunable bandpass filters has been proven, waveguide filters limit the filter operation to sub-octave bands (i.e., waveguide bandwidth). Also, waveguide structures are large and are therefore not suitable for incorporation into a portable spectrum analyzer. Furthermore, to achieve operation from 26.5 to 50 GHz, two switched waveguide filters and mixers are needed to cover respective frequency ranges of 26 to 40 GHz and 40 to 50 GHz.

The prior art circuit shown in FIG. 1 also has several additional drawbacks. RF input signals in the frequency range of 26.5 to 40 GHz are diplexed to the tunable bandpass filter 21 which is used as a preselector. A filtered signal is passed through the fixed attenuator 22 and applied to the harmonic mixer 23, where it is mixed with harmonics of the swept, YIG-tuned local oscillator (LO) 18 to produce the predetermined IF output signal. Since the tunable bandpass filter 21 and the harmonic mixer 23 are separated by coaxial cable, the fixed attenuator 22 is required to decrease the mismatch ripple between the filter and mixer. Therefore, the sensitivity of the spectrum analyzer is drastically reduced.

Additionally, a schematic diagram of one known waveguide harmonic mixer 23 is shown in FIG. 1A. This mixer comprises a tapered waveguide 24 to which the RF input signals are applied.

RF input signals at an input of the tapered waveguide 24 travel along the tapered waveguide to a reduced height output of the tapered waveguide, where an anti-parallel pair of diodes 25 is connected to one side of the tapered waveguide and a low-pass filter 26 comprising inductor L and capacitors C is connected to the other side of the tapered waveguide. An LO signal enters through a coaxial LO input, a capacitor 27, and the low-pass filter 26 to the anti-parallel pair of diodes 25. Mixing with the RF input signals occurs in the anti-parallel pair of diodes 25 as an even harmonic mixer. An IF signal produced in the anti-parallel pair of diodes 25 at 321.4 MHz is diplexed to an IF output port using the diplexing effect of an inductor 28 and the capacitor 27. This single-ended even harmonic mixer has the drawback of mixing broadband LO noise at $2f_{LO}+f_{IF}$ and $2f_{LO}-f_{IF}$ with the IF frequency, which increases the noise figure of the spectrum analyzer.

SUMMARY OF THE INVENTION

One embodiment of the invention provides an integrated routing barium-ferrite tuned resonator filter and mixer in which low-frequency input signals are preferably routed to a low-frequency output and high-frequency input signals are routed to four barium-ferrite tuned resonators combined to provide a tunable bandpass filter and image-enhanced, single-balanced mixer. An electromagnet produces a DC magnetic field that is uniform over the four barium-ferrite resonators to tune the resonance frequency of the resonators. The first barium-ferrite resonator acts as a first stage of the filter and, in combination with a routing circuit comprising three PIN diodes, routes the input signal either to the low-frequency output or to succeeding stages of the filter and mixer. The second barium-ferrite resonator acts as a second stage of the filter. The third barium-ferrite resonator acts as a third stage of the filter. The fourth barium-ferrite resonator acts as a fourth stage of the filter, as well as an image-enhanced, single-balanced mixer capable of even harmonic mixing. The mixer combines the RF input signal with a harmonic of a swept local oscillator (LO) signal to produce an IF output signal at an IF output.

The integrated routing barium-ferrite tuned resonator filter and mixer in accordance with one embodiment of the invention provides higher frequency coverage in portable spectrum analysis. One exemplary implementation of the integrated routing barium-ferrite tuned resonator filter and mixer is configured to operate over the frequency range of 26.5 to 50 GHz and provides an integrated front end downconverter in a 50 GHz high-performance portable spectrum analyzer.

BRIEF DESCRIPTION OF THE DRWINGS

The above and other objects and features and the concomitant advantages of the present invention will be better understood and appreciated by those skilled in the art in view of the description of the preferred embodiments given below in conjunction with the accompanying drawings. In the drawings.

Figure 3:
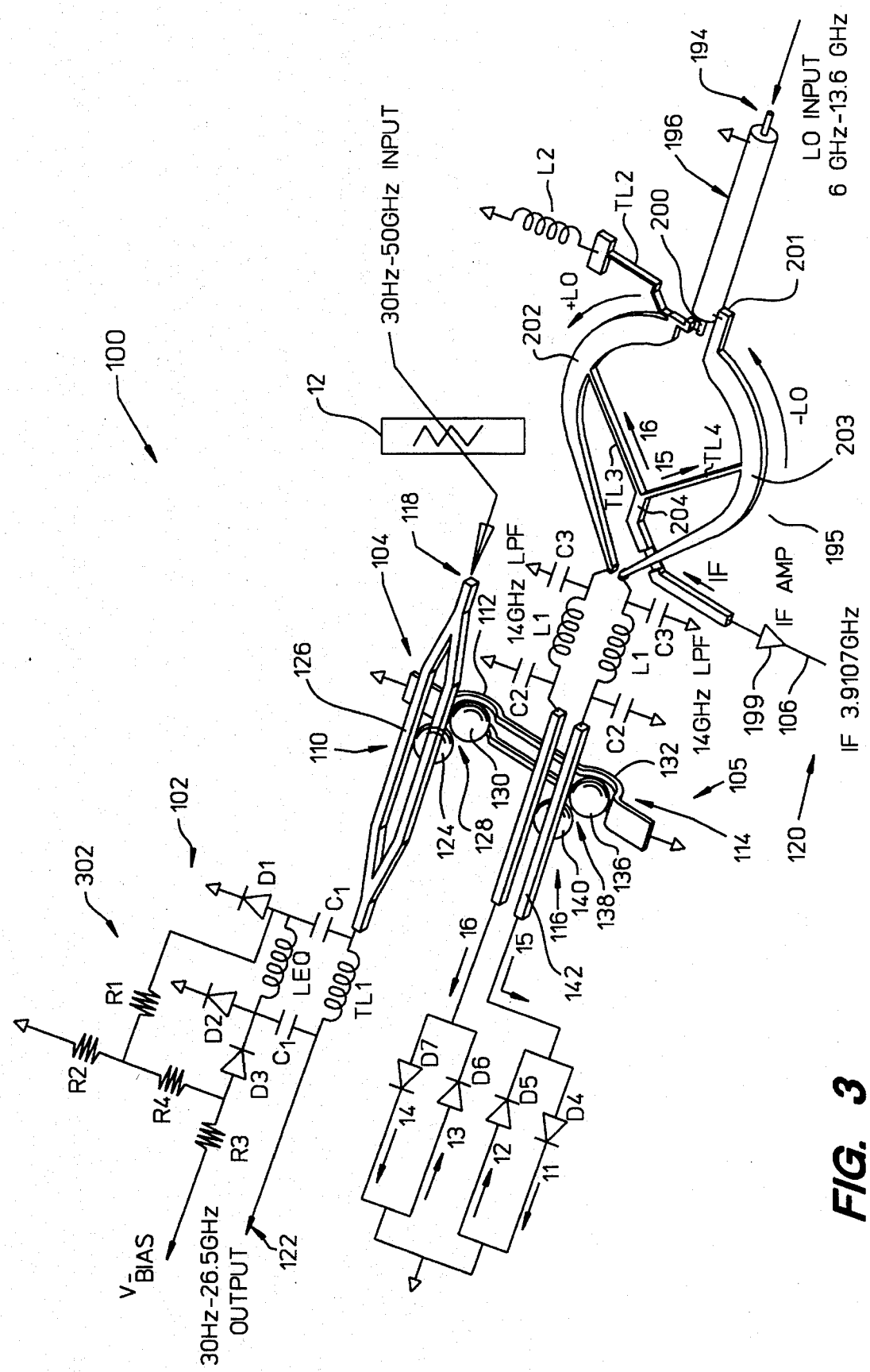
FIG. 3 is a schematic diagram of one embodiment of a routing barium-ferrite tuned resonator filter and image-enhanced, single-balanced mixer circuit constructed in accordance with the invention, which mixes even harmonic products of a local oscillator signal with an RF input signal to produce a predetermined IF signal output.
Figure 8:
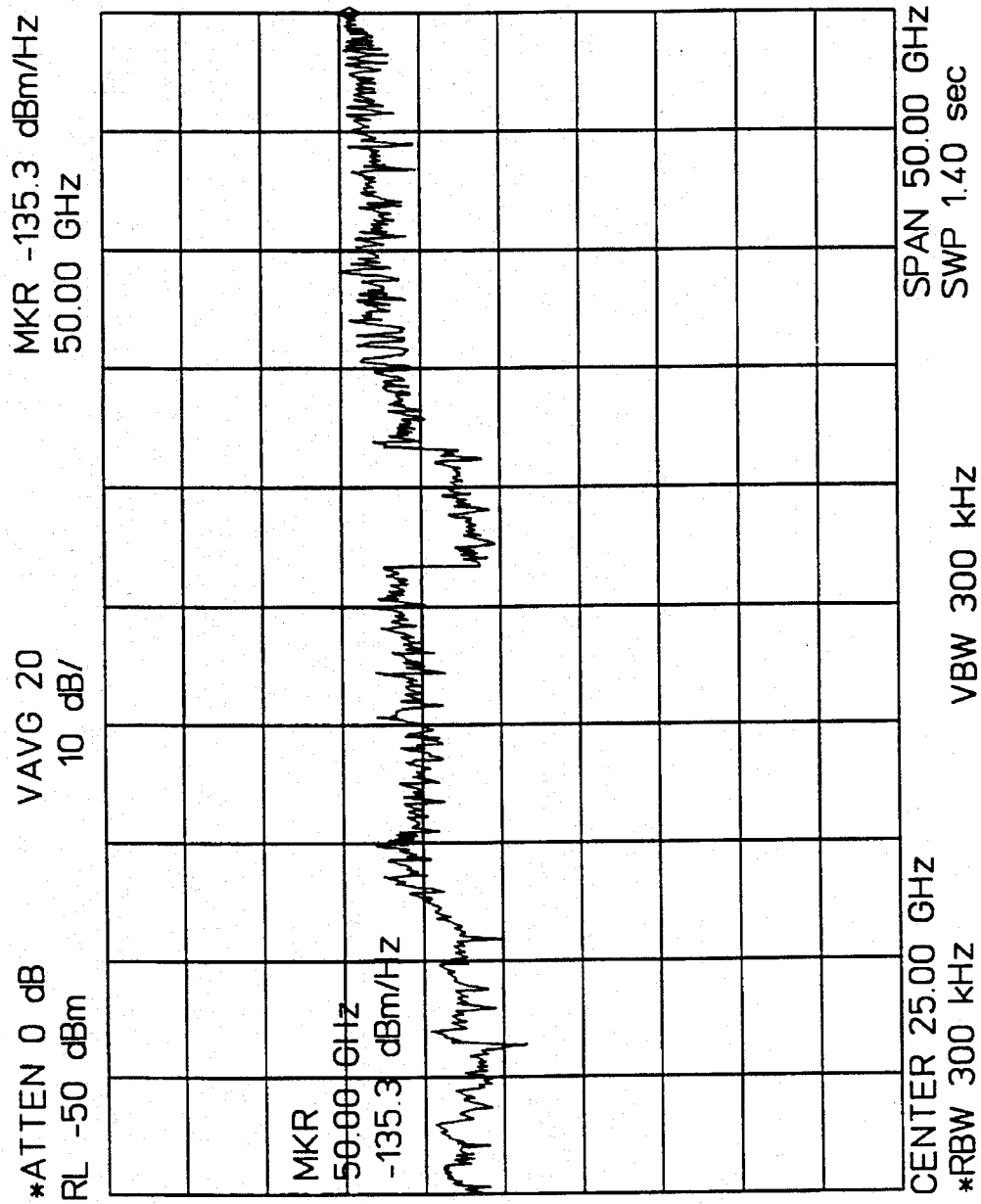
Figure 9:
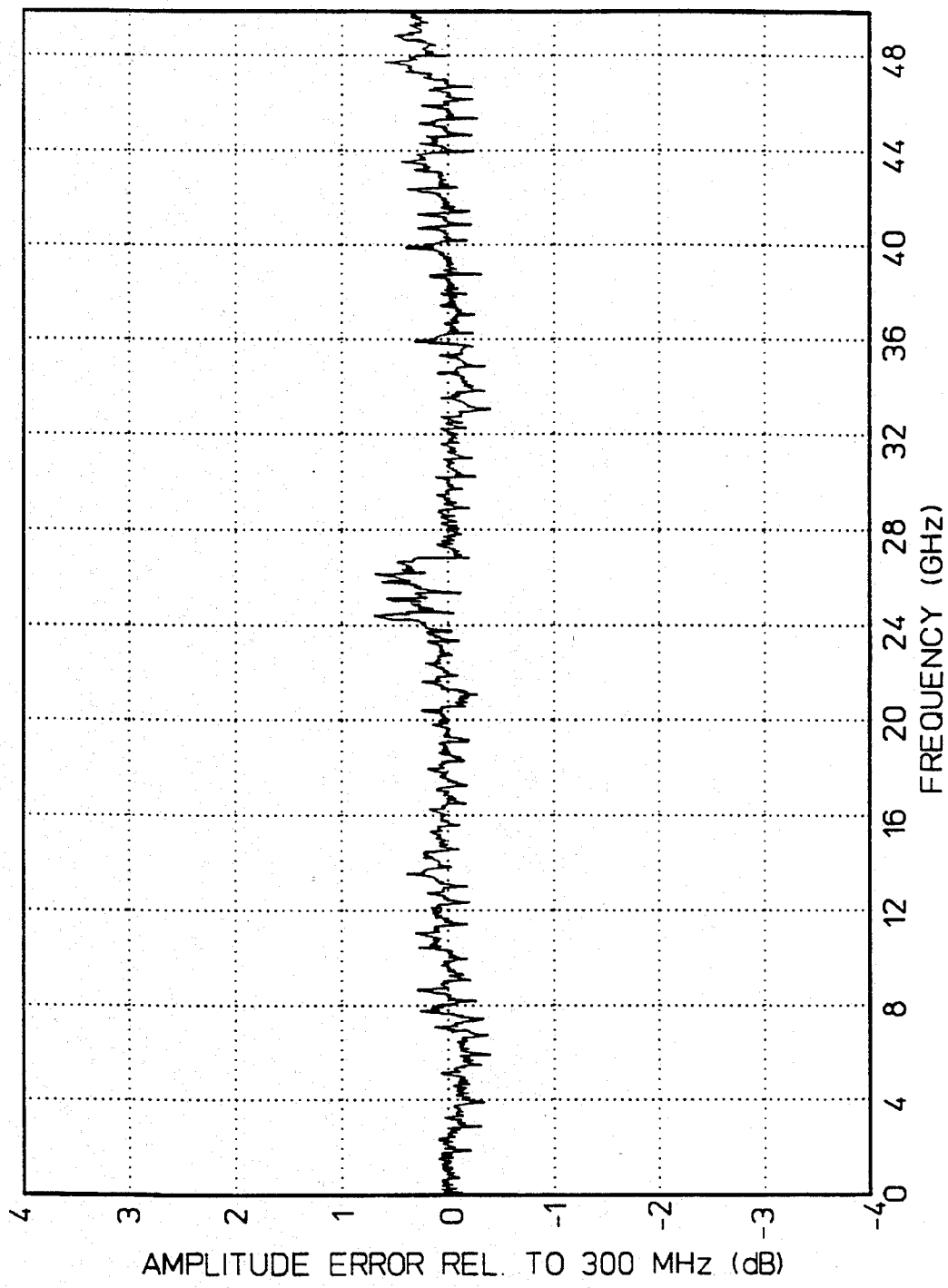

FIG. 8 illustrates the spectrum analyzer noise floor using the routing barium-ferrite tuned resonator filter and image-enhanced, single-balanced mixer circuit shown in FIG. 3 from 30 Hz to 50 GHz; and FIG. 9 illustrates the spectrum analyzer frequency response using the routing barium-ferrite tuned resonator filter and image-enhanced, single-balanced mixer circuit shown in FIG. 3 from 20 MHz to 50 GHz.

DETAILED DESCRIPTION OF THE PREFERRED EMBDOIMENTS

Figure 1:
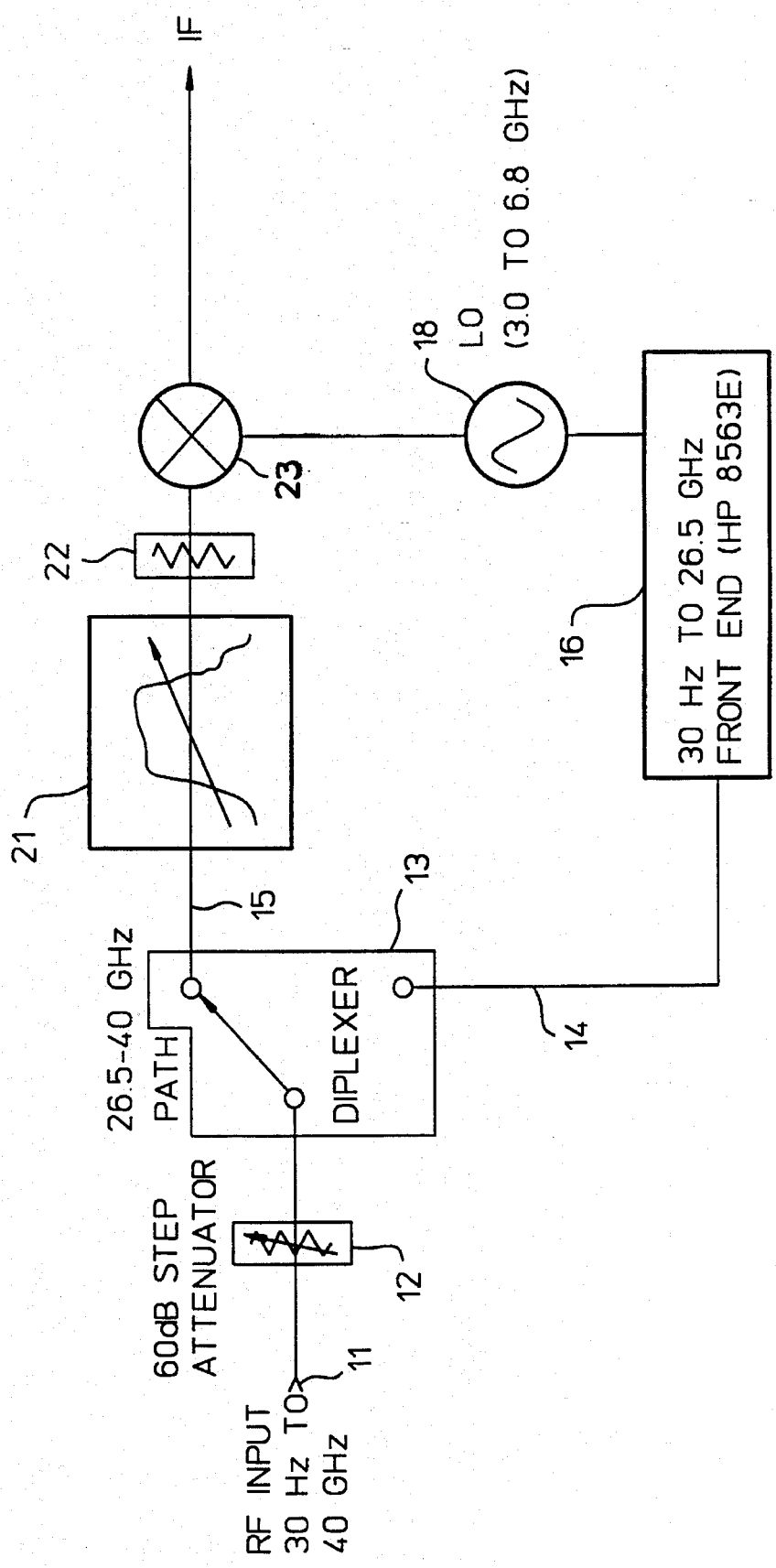
FIG. 1 is a block diagram of a prior art circuit in a spectrum analyzer.
Figure 1A:
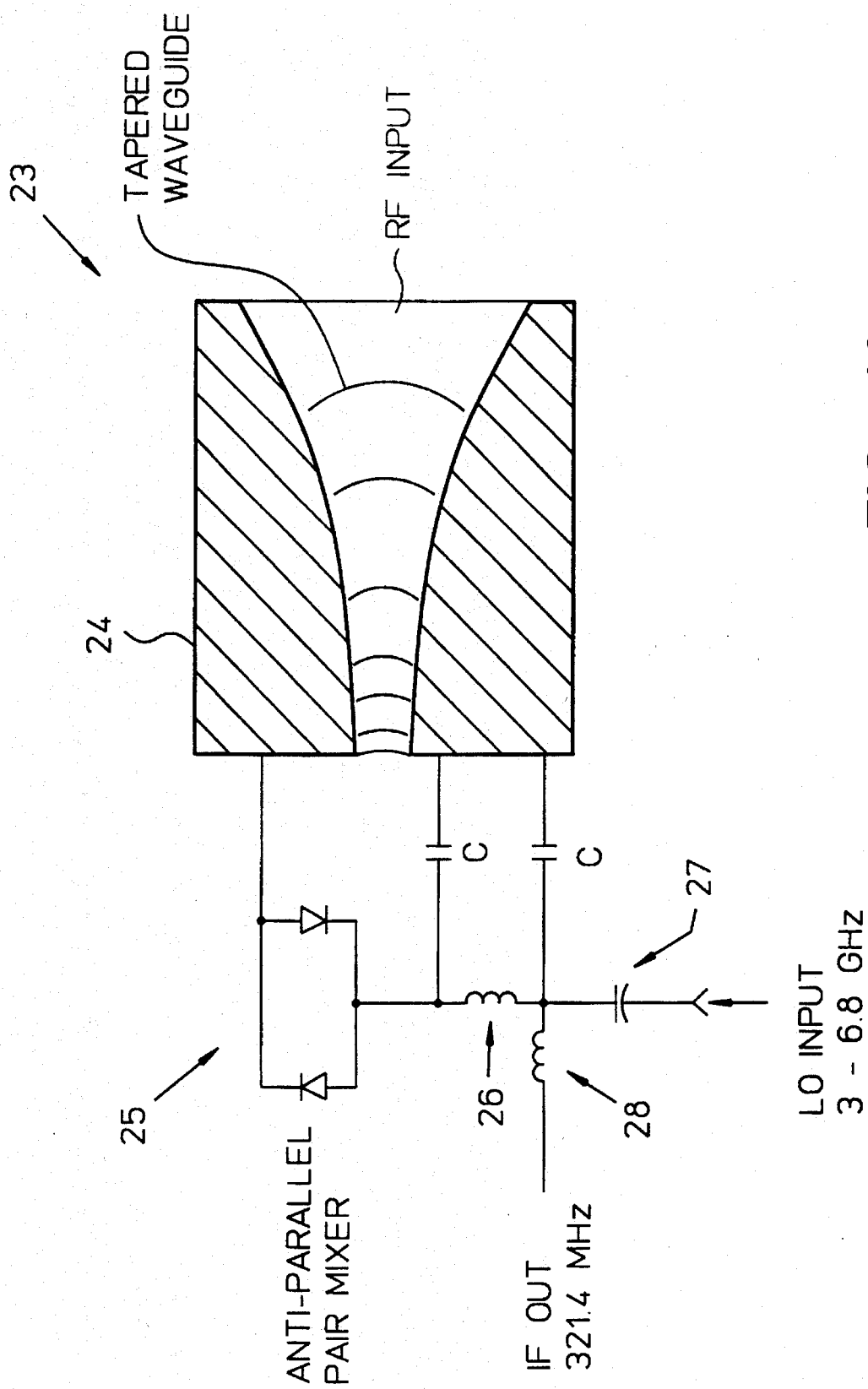
FIG. 1A is a schematic diagram of a prior art mixer circuit used in the circuit shown in FIG. 1.
Figure 2:
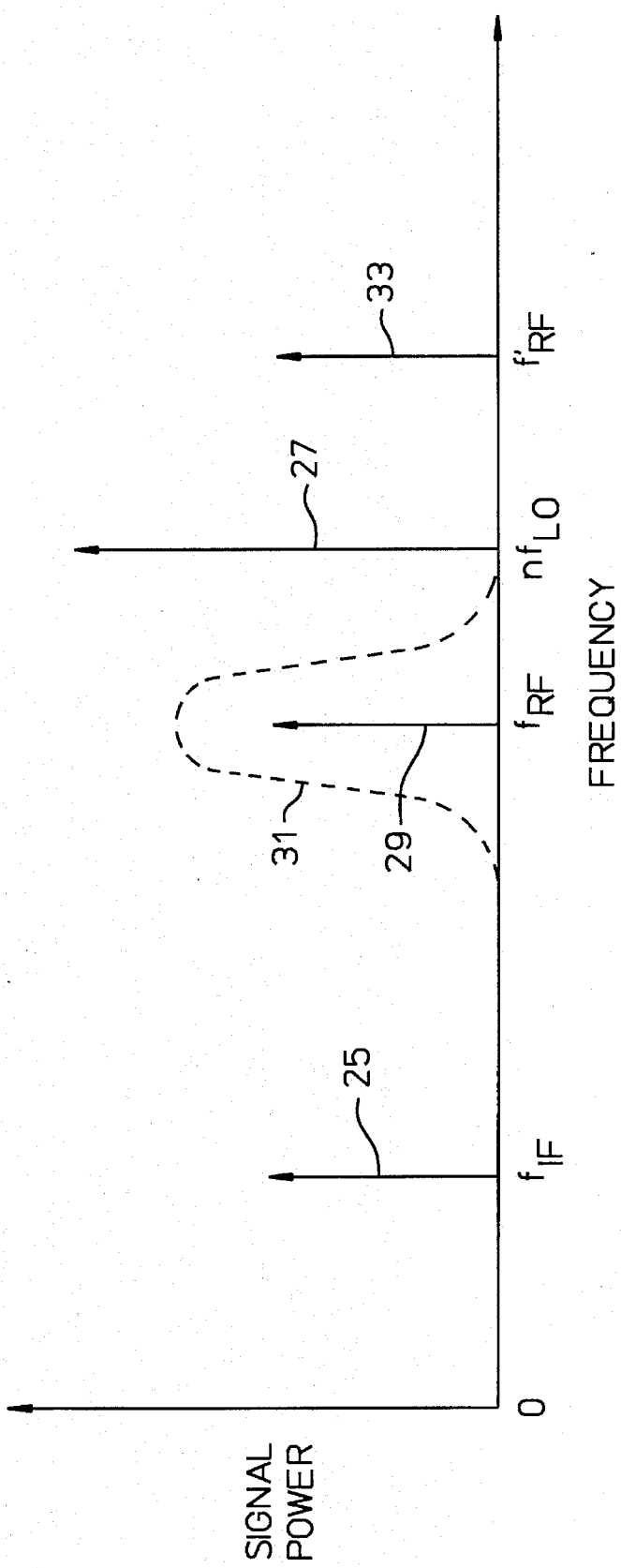
FIG. 2 is a graph which illustrates the relationship of RF, LO, and IF signals in the prior art circuit shown in FIG. 1.

In accordance with a preferred embodiment of the invention, the diplexer 13, tunable bandpass filter 21, and harmonic mixer 23 shown in the block diagram of FIG. 1 comprise a routing barium-ferrite tuned resonator filter and mixer circuit in accordance with the invention, generally indicated by the numeral 100, which is shown in FIG. 3. Routing barium-ferrite tuned resonator filter and mixer circuit 100 comprises an electronically switched, barium-ferrite tuned resonator filter integrated with an image-enhanced, single-balanced barium-ferrite tuned mixer to provide spectrum analysis from 26.5 to 50 GHz. Routing barium-ferrite tuned resonator filter and mixer circuit 100 incorporates a diode bridge mixer circuit topology and preferably employs a high level of integration. Routing barium-ferrite tuned resonator filter and mixer circuit 100 can be incorporated into a high-performance portable spectrum analyzer, for example.

As shown in FIG. 3, routing barium-ferrite tuned resonator filter and mixer circuit 100 comprises a routing circuit 102 and a four-sphere, barium-ferrite tuned preselector 104 in which the input barium-ferrite sphere combined with an integrated hybrid PIN diode switch replace a conventional diplexer. Preselector 104 functions as a highly selective tunable bandpass filter to attenuate unwanted mixing products, such as image and multiple responses. In conjunction with the fourth barium-ferrite sphere, a monolithic GaAs Schottky diode integrated circuit functions as a highly efficient image-enhanced, single-balanced barium-ferrite tuned mixer 105 having an isolated IF port 106. To achieve the desired mixing product, preselector 104 is tuned to the frequency of an RF input signal applied to an input 118 through step attenuator 12, the correct local oscillator (LO) signal is applied to mixer 105, and depending upon the desired mixing harmonic number, the predetermined IF signal output is extracted at IF port 106.

RF input signals are connected to routing barium-ferrite tuned resonator filter and mixer circuit 100, where they are routed to either a microwave or millimeter path using the integrated hybrid PIN diode switch comprising three PIN diodes. When tuned below 26.5 GHz, input signals are processed using a conventional front end component. RF input signals from 26.5 to 50 GHz are routed through a barium-ferrite tunable bandpass filter in the form of preselector 104 and then down-converted using integrated image-enhanced, single-balanced barium-ferrite tuned harmonic mixer 105.

In accordance with one embodiment of the invention, a different approach was adopted to achieve high performance and small size in routing barium-ferrite tuned resonator filter and mixer circuit 100. Because of the high saturation magnetization of barium-ferrite (i.e., >3,700 Gauss), alternatives to loop coupling structures can be used to provide resonance-free tunable bandpass filter structures to 50 GHz. Specifically, stripline-to-sphere coupling and iris coupling (sphere-to-sphere) are employed. As a result, routing barium-ferrite tuned resonator filter and mixer circuit 100 incorporates various coupling structures, including stripline-to-sphere coupling, iris coupling, and low-inductance loop coupling.

As shown in FIG. 3, routing barium-ferrite tuned resonator filter and mixer circuit 100 preferably includes an input resonator 110, a first intermediate resonator 112, a second intermediate resonator 114, and an output resonator 116. Resonators 110, 112, 114, and 116 are connected in series between input 118, to which input signals are applied, and an IF output 120 comprising IF port 106. Preferably, input 118 is also connected to a low-frequency output 122, as will be described later. Input 118, IF output 120, and low-frequency output 122 can be in the form of coaxial connections.

Input resonator 110 includes a barium-ferrite sphere 124 mounted between an input suspended stripline coupling 126 and an iris coupling 128. Resonator 112 includes a barium-ferrite sphere 130 mounted between iris coupling 128 and a low-inductance coupling loop 132. Resonator 114 includes a barium-ferrite sphere 136 mounted between coupling loop 132 and an iris coupling 138. Output resonator 116 includes a barium-ferrite sphere 140 mounted between iris coupling 138 and an output suspended stripline coupling 142. Each of the suspended stripline couplings 126 and 142 and the coupling loop 132 are conductive.

Figure 4A:
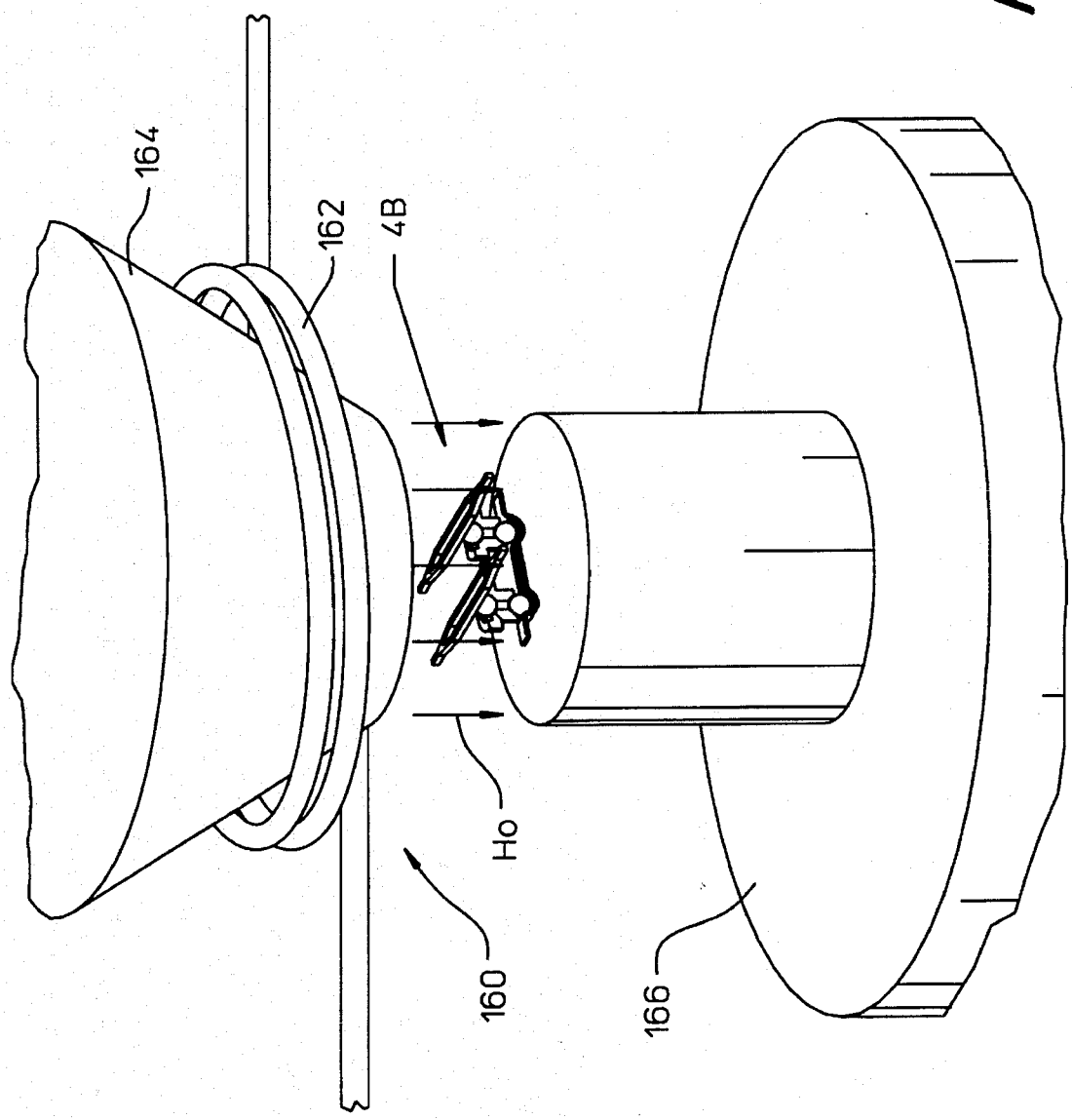
FIG. 4 is a simplified perspective view of a portion of the routing barium-ferrite tuned resonator filter and image-enhanced, single-balanced mixer circuit shown schematically in FIG. 3.

As shown in FIG. 4, barium-ferrite spheres 124 and 130 are preferably mounted on an annular holder 129 preferably glued circumferentially within iris coupling 128, and barium-ferrite spheres 136 and 140 are preferably mounted on an annular holder 139 preferably glued circumferentially within iris coupling 138. Holders 129 and 139 are electrically insulating and non-magnetic. Further details of the construction of holders 129 and 139 appear in U.S. Pat. No. 4,888,569, the disclosure of which is hereby incorporated herein in its entirety by this reference.

As shown in FIG. 3, input suspended stripline coupling 126 has a first end which is connected to input 118. Iris coupling is used to couple from barium-ferrite sphere 124 to barium-ferrite sphere 130 and from barium-ferrite sphere 136 to barium-ferrite sphere 140. Unlike most YIG tunable bandpass filters that have spheres placed on adjustable holders, all four barium-ferrite spheres 124, 130, 136, and 140 are magnetically aligned and hard mounted in the filter assembly to eliminate time consuming tuning procedures and to provide a more compact construction. Low-inductance loop coupling transfers signals from barium-ferrite sphere 130 to barium-ferrite sphere 136. Output suspended stripline coupling 142 is connected to IF output 120.

While the first end of input suspended stripline coupling 126 is connected to input 118, a second end of input suspended stripline coupling 126 is preferably connected to routing circuit 102. On the one hand, routing circuit 102 couples input signals in the frequency range from approximately 0 to 26.5 GHz, for example, to low-frequency output 122 to which a low-frequency signal processing section, such as disclosed in aforementioned U.S. Patent application Ser. No. 08/094,833 filed on Jul. 20, 1993, can be connected. On the other hand, routing circuit 102 causes RF input signals greater than approximately 26.5 GHz to be coupled from input suspended stripline coupling 126 by barium-ferrite sphere 124 to iris coupling 128. Routing circuit 102 will be described in more detail later. In an alternate embodiment in which only high-frequency signals are to be processed, routing circuit 102 would be eliminated, and the second end of input suspended stripline coupling 126 would be connected to ground (common).

As shown in FIG. 4, an external DC magnetic field $H_0$ is applied to resonators 110, 112, 114, and 116 (represented in FIG. 4 by barium-ferrite spheres 124, 130, 136, and 140, respectively). DC magnetic field $H_0$ is generated by an electromagnet 160 having a coil 162. Resonators 110, 112, 114, and 116 are positioned in a gap between a fixed polepiece 164 and an adjustable polepiece 166. By varying the magnitude of DC magnetic field $H_0$ through controlling the current flowing in coil 162 of electromagnet 160, the resonance frequency of resonators 110, 112, 114, and 116 is tuned over a desired frequency range. Specifically, as DC magnetic field $H_0$ is increased, the resonance frequency is increased.

In an exemplary implementation of routing barium-ferrite tuned resonator filter and mixer circuit 100 shown in FIG. 3, barium-ferrite spheres 124, 130, 136, and 140 have diameters of about 0.3 min. Holders 129 and 139 of iris couplings 128 and 138, respectively, in which barium-ferrite spheres 124, 130, 136, and 140 are mounted, are constructed from sapphire. The radius of coupling loop 132 is about 0.205 min. The ends of coupling loop 132 are connected to ground.

In operation, an RF input signal received at input 118 causes a current to flow through input suspended stripline coupling 126. In the preferred embodiment which incorporates routing circuit 102, any input signal having a frequency from approximately 0 to 26.5 GHz, for example, flows from input suspended stripline coupling 126 through routing circuit 102 to low-frequency output 122. Any input signal having a frequency from approximately 26.5 to 50 GHz, for example, results in an RF current in input suspended stripline coupling 126 which produces an RF magnetic field in the vicinity of barium-ferrite sphere 124. In the absence of barium-ferrite sphere 124, the RF magnetic field is not coupled through iris coupling 128. However, when externally applied DC magnetic field $H_0$ causes barium-ferrite sphere 124 to have a resonance frequency that is the same or nearly the same as the frequency of the RF input signal, the RF signal causes the dipoles in barium-ferrite sphere 124 to precess at the frequency of the RF input signal. The precessing dipoles create a circularly polarized RF magnetic field which is coupled through iris coupling 128. Off the resonance frequency of barium-ferrite spheres 124 and 130, the small diameter of iris coupling 128 substantially prevents energy from coupling from input suspended stripline coupling 126 to coupling loop 132. Thus, resonator 110 passes RF signals having the same or nearly the same frequency as the resonance frequency of barium-ferrite sphere 124. Resonators 112, 114, and 116 operate in the same manner to provide a highly selective tuneable RF bandpass filter. By varying DC magnetic field $H_0$ responsive to varying the current through coil 162 of electromagnet 160, the passband of the tunable bandpass filter comprised of resonators 110, 112, 114, and 116 is tuned over a broad frequency range. Routing barium-ferrite tuned resonator filter and mixer circuit 100 with this topology has typical insertion loss of 13 dB and a 3 dB bandwidth of 200 MHz.

In the embodiment of routing barium-ferrite tuned resonator filter and mixer circuit 100 shown in FIG. 3, output resonator 116 also comprises image-enhanced, single-balanced barium-ferrite tuned mixer 105. An LO signal is applied to mixer 105 through an LO input 194 and a coaxial marchand balun 196. LO input 194 can be in the form of a coaxial connection, as shown in FIG. 3. The IF output signal of mixer 105 appears at IF output 120 comprising IF port 106. Mixer 105 will be described in more detail later. Initially, however, routing circuit 102 will now be described.

Preferably, in order to achieve continuous sweeps from approximately 0 to 50 GHz, routing circuit 102 comprises a hybrid PIN diode switch integrated with the first stage of the barium-ferrite tuned resonator filter of routing barium-ferrite tuned resonator filter and mixer circuit 100, as shown in FIG. 3. Input suspended stripline coupling 126 in conjunction with an integrated capacitor and two PIN diodes are used as both the switch and the coupling structure to input resonator 110. Routing circuit 102 has the following circuit configuration and provides the desired alternate low-frequency band and high-frequency band switching operation, as follows.

As shown in FIG. 3, input signals applied to input 118 propagate through input suspended stripline coupling 126. Input suspended stripline coupling 126 in conjunction with routing circuit 102 and an associated bias network 302 comprising a third PIN diode provide a low-loss electronic switch to route low-frequency input signals to low-frequency output 122 and to couple high-frequency input signals through input resonator 110 to iris coupling 128 to be down-converted, as will be described in more detail later.

On the one hand, input signals in the frequency range from approximately 0 to 26.5 GHz, for example, are routed to low-frequency output 122 with a maximum loss of 3.2 dB. On the other hand, RF input signals in the frequency range from approximately 26.5 to 50 GHz are coupled to input resonator 110 by the input suspended stripline coupling 126.

As shown in FIG. 3, routing circuit 102 comprises a transmission line $TL_1$ connected in series between the second end of input suspended stripline coupling 126 and low-frequency output 122. Routing circuit 102 also comprises an integrated capacitor $C_1$ connected in parallel with transmission line $TL_1$. Integrated capacitor $C_1$ has an equivalent inductance $L_{EQ}$ represented in FIG. 3 in parallel with capacitor $C_1$ and also in parallel with transmission line $TL_1$. Routing circuit 102 further comprises a first diode $D_1$ connected in series with integrated capacitor $C_1$ between the junction of input suspended stripline coupling 126 and transmission line $TL_1$, on the one hand, and ground, on the other hand. Routing circuit 102 additionally comprises a second diode $D_2$ connected in series with integrated capacitor $C_1$ between the junction of transmission line $TL_1$ and low-frequency output 122, on the one hand, and ground, on the other hand. Additionally, routing circuit 102 comprises bias network 302. Bias network 302 comprises a resistor $R_1$ having a first end connected to the junction of integrated capacitor $C_1$ and diode $D_1$ and a resistor $R_2$ having a first end connected to a second end of resistor $R_1$ and a second end connected to ground. Bias network 302 also comprises a diode $D_3$ connected between the junction of integrated capacitor $C_1$ and diode $D_2$, on the one hand, and a first end of a resistor $R_3$, on the other hand. Diodes $D_1$, $D_2$, and $D_3$ are preferably PIN diodes. Bias network 302 further comprises a resistor $R_4$ having a first end connected to the junction of resistors $R_1$ and $R_2$, on the one hand, and a second end connected to the junction of diode $D_3$ and resistor $R_3$, on the other hand. A bias voltage V- is selectively connected to a second end of resistor $R_3$ to simultaneously reverse-bias diodes $D_1$, $D_2$, and $D_3$ "off" through resistors $R_1$, $R_2$, and $R_4$. Otherwise, diodes $D_1$ and $D_2$ are "on" in the presence of input signals at input 118.

Figure 5:
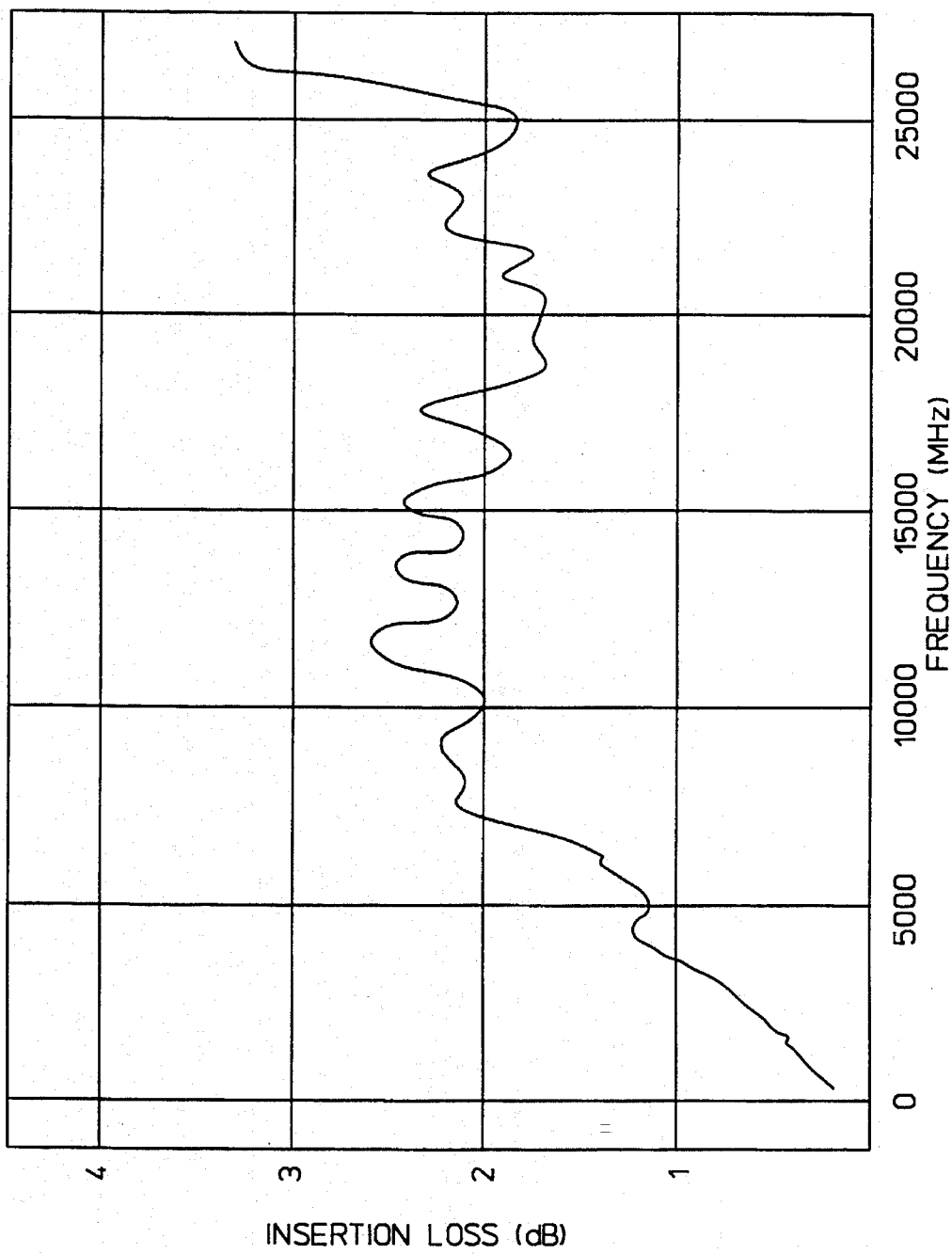
FIG. 5 illustrates PIN diode switch insertion loss to 26 GHz for the routing barium-ferrite tuned resonator filter and image-enhanced, single-balanced mixer circuit shown in FIG. 3.

In operation, low-band input signals from approximately 0 to 26.5 GHz are directed to low-frequency output 122 and hence to a low-frequency signal processing section (not shown) by biasing "off" diodes $D_1$, $D_2$, and $D_3$. When diodes $D_1$ and $D_2$ are reverse-biased, the combination of the inductances of input suspended stripline coupling 126 and transmission line $TL_1$ and the "off" capacitance of diodes $D_1$ and $D_2$ create a low-pass filter, routing approximately 0 to 26.5 GHz input signals to low-frequency output 122 for further processing. FIG. 5 illustrates typical insertion loss of routing circuit 102 to 26.5 GHz.

For input signals from approximately 26.5 to 50 GHz, diodes $D_1$ and $D_2$ are forward-biased (turned "on"), presenting a low impedance at the second end of input suspended stripline coupling 126. Turning "on" diodes $D_1$ and $D_2$ grounds the RF signals flowing through input suspended stripline coupling 126 just beyond input resonator 110. Grounding the RF signals produces a strong horizontal RF magnetic field incident upon input resonator 110. The applied RF signal couples to input resonator 110 if the RF frequency is equal to the tuned resonance frequency of input resonator 110. The resonance frequency is tuned by varying the applied DC magnetic field $H_0$ to develop a tunable preselector filter. This assures efficient coupling of RF input signals to barium-ferrite sphere 124.

Considered in more detail, routing circuit 102 operates as follows. Input signals in the frequency range from approximately 0 to 26.5 GHz applied to input 118 flow through input suspended stripline coupling 126. With diodes $D_1$ and $D_2$ reversed-biased (turned "off"), the "off" capacitance of diodes $D_1$ and $D_2$ in combination with the inductances of input suspended stripline coupling 126 and transmission line $TL_1$ provide a low-loss low-pass filter preferably having a 28 GHz cutoff frequency.

As the frequency of input signals increases above approximately 100 MHz, for example, the impedance of integrated capacitor $C_1$ decreases. Resistors $R_1$, $R_2$, $R_3$, and $R_4$ are needed to reverse-bias diodes $D_1$, $D_2$, and $D_3$ so that diodes $D_1$, $D_2$, and $D_3$ are not turned "on" by the input signal. Resistors $R_1$, $R_2$, $R_3$, and $R_4$ are used as a voltage divider to reverse-bias diodes $D_1$, $D_2$, and $D_3$ simultaneously. Resistors $R_1$, $R_2$, $R_3$, and $R_4$ appear as a load at the junction between the second end of input suspended stripline coupling 126 and transmission line $TL_1$. Additionally, the "off" capacitance of diode $D_3$ (i.e., c~ 0.025 pf) increases the effective impedance presented by resistors $R_2$, $R_3$, and $R_4$ to integrated capacitor $C_1$, thereby reducing the loading effect of resistors $R_2$, $R_3$, and $R_4$ on the input signal.

For RF input signals in the frequency range from approximately 26.5 to 50 GHz, diodes $D_1$ and $D_2$ are forward-biased (turned "on"). Consequently, diode $D_1$ produces a very low impedance at the second end of input suspended stripline coupling 126, causing the RF input signals to couple through barium-ferrite sphere 124 to iris coupling 128. In order for resistor $R_1$ not to load RF input signals, its width is selected to be 20.0 μm. With a width this narrow, the power handling capability of resistor $R_1$ is low. Therefore, diode $D_3$ is incorporated to turn diodes $D_1$ and $D_2$ "on," and, consequently, no "on" current flows through resistor $R_1$.

Since low-frequency output 122 is connected to an unknown impedance in parallel with the series combination of integrated capacitor $C_1$ and diode $D_1$ and associated interconnect inductance, at some frequencies in the frequency band from approximately 26.5 to 50 GHz a parallel resonance could occur if diode $D_2$ were not present. However, in the presence of diode $D_2$ being forward-biased (turned "on"), the unknown impedance connected to low-frequency output 122 is loaded by the series combination of integrated capacitor $C_1$ and the low "on" resistance of diode $D_2$, avoiding any potential parallel resonance of integrated capacitor $C_1$ and diode $D_1$ with an unknown impedance connected to low-frequency output 122.

Referring again to FIG. 3, in routing barium-ferrite tuned resonator filter and mixer circuit 100, a four-stage, four-pole barium-ferrite tuned bandpass filter or preselector 104 comprising resonators 110, 112, 114, and 116 is used to achieve a high degree of selectivity (greater than 65 dB off-resonance isolation). RF input signals in the frequency range from approximately 26.5 to 50 GHz are filtered by the first, second, and third stages of preselector 104 and then applied to the fourth stage. The fourth stage comprising resonator 116 operates both as the fourth filter stage and as an element of image-enhanced, single-balanced barium-ferrite tuned mixer 105 to down-convert RF input signals to the predetermined IF output signal.

FIG. 3 shows a schematic diagram of the fourth stage of preselector 104, as well as image-enhanced, single-balanced barium-ferrite tuned mixer 105. Mixer 105 comprises output suspended stripline coupling 142. Output suspended stripline coupling 142 is terminated at a first end by a monolithic GaAs diode integrated circuit comprising a diode bridge including diodes $D_4$, $D_5$, $D_6$, and $D_7$. Output suspended stripline coupling 142 preferably comprises the beam leads of the monolithic GaAs diode integrated circuit. Diodes $D_4$, $D_5$, $D_6$, and $D_7$ are preferably Schottky diodes integrated with the beam leads that form output suspended stripline coupling 142.

As shown in FIG. 3, image-enhanced, single-balanced barium-ferrite tuned mixer 105 additionally comprises inductors $L_1$ having respective first ends connected to a second end of output suspended stripline coupling 142 and respective second ends connected to a first end of an LO and IF diplexer 195. Mixer 105 further comprises capacitors $C_2$ connected between the respective junctions of the first ends of inductors $L_1$ and the second end of output suspended stripline coupling 142, on the one hand, and ground, on the other hand. Mixer 105 also comprises capacitors $C_3$ connected between the respective junctions of the second ends of inductors $L_1$ and the first end of LO and IF diplexer 195, on the one hand, and ground, on the other hand. A second end of LO and IF diplexer 195 is connected to a first end of marchand balun 196. More specifically, a port 200 of LO and IF diplexer 195 is connected to a center conductor of marchand balun 196. Port 200 of LO and IF diplexer 195 is also connected in series through a second transmission line $TL_2$ and an inductor $L_2$ to ground. A port 201 of LO and IF diplexer 195 is connected to an outer shield of marchand balun 196. A node 202 of LO and IF diplexer 195 is connected in series with a third transmission line $TL_3$ to a node 204. A node 203 of LO and IF diplexer 195 is connected in series with a fourth transmission line $TL_4$ to node 204. Node 204 is connected in series with an IF amplifier 199 to IF port 106. The outer shield of marchand balun 196 is connected to ground. Finally, a second end of marchand balun 196 is connected to LO input 194.

Marchand balun 196 transforms the LO signal which appears at LO input 194 into a balanced signal. The combination of LO and IF diplexer 195 and the 14 GHz low-pass filter comprising capacitors $C_2$ and $C_3$ and inductors $L_1$ matches the output impedance of marchand balun 196 to the diode pairs $D_4$, $D_5$ and $D_6$, $D_7$, delivering a balanced LO signal to the mixer diodes. Diodes $D_4$ and $D_7$ are driven by the positive half-cycle of the LO signal. Conversely, diodes $D_5$ and $D_6$ are driven by the negative half cycle of the LO signal.

LO and IF diplexer 195 routes the LO signal to diodes $D_4$, $D_5$, $D_6$, and $D_7$ and extracts the IF output signal from the LO signal. The LO signal enters the center conductor of marchand balun 196 at LO input 194. The center conductor of marchand balun 196 is connected to LO and IF diplexer 195 at port 200. The outer shield at the second end of marchand balun 196 is grounded, and the first end of the outer shield of the marchand balun connected to LO and IF diplexer 195 at port 201 is floating. Inductor $L_2$ and transmission line $TL_2$ produce the same inductance at port 200 as the outer shield of marchand balun 196 produces at port 201 to ground. Ports 200 and 201 have balanced LO signals flowing through them (i.e., $+V_{LO}$ and $-V_{LO}$, respectively). Transmission lines $TL_3$ and $TL_4$ connect respective nodes 202 and 203 to node 204 so that node 204 is a virtual ground for the LO signal. The length of transmission lines $TL_3$ and $TL_4$ is selected to be $\lambda/4$ at the center of the LO frequency range, thereby rotating the impedance at node 204 from virtual ground to an open at nodes 202 and 203 and effectively removing the effect of transmission lines $TL_3$ and $TL_4$ and their connection at node 204. Therefore, the LO signal is delivered to the 14 GHz low-pass filter comprising capacitors $C_2$ and $C_3$ and inductors $L_1$ and hence to diodes $D_4$, $D_5$, $D_6$, and $D_7$ with minimal loss.

Also, the IF signal travelling down LO and IF diplexer 195 reaches nodes 202 and 203 in a common mode. The combination of inductor $L_2$ and transmission line $TL_2$ connected to LO and IF diplexer 195 at port 200 results in an impedance transformation at port 200 which produces an open at node 202 at the IF frequency (e.g., 3.9107 GHz).

Also, the combination of the inductance of the outer shield of marchand balun 196 connected to LO and IF diplexer 195 at port 201 results in an impedance transformation at port 201 which produces an open at node 203 at the IF frequency (e.g., 3.9107 GHz). Therefore, the IF signal flows through transmission lines $TL_3$ and $TL_4$ to node 204 and from node 204 through IF amplifier 199 to IF port 106. Also, IF signals reaching ports 200 and 201 are common mode and therefore do not propagate into marchand balun 196.

The 14 GHz low-pass filter presents a very low impedance to signals above 26 GHz. This impedance reflects all mixing products at and above 26 GHz back to diodes $D_4$, $D_5$, $D_6$, and $D_7$ for remixing, thereby improving mixing efficiency.

Barium-ferrite sphere 140 transforms the RF input signal flowing through iris coupling 138 into an RF current flowing in output suspended stripline coupling 142. The RF signal from the fourth stage of preselector 104 comprising barium-ferrite sphere 140 is coupled to output suspended stripline coupling 142 formed by the beam leads of the monolithic GaAs diode integrated circuit extending over the sphere. The first ends of these beam leads are connected to capacitors $C_2$ comprising the 14 GHz low-pass filter, while the second ends are connected to anti-parallel diode pairs $D_4$, $D_5$ and $D_6$, $D_7$. As previously mentioned, the 14 GHz low-pass filter produces a very low impedance for frequencies above 26 GHz. Therefore, coupled RF currents flow through capacitors $C_2$ to the anti-parallel diode pairs $D_4$, $D_5$ and $D_6$, $D_7$. This RF current mixes with the LO signal applied to LO input 194, or appropriate harmonics of the LO signal inside diodes $D_4$, $D_5$, $D_6$, and $D_7$, thus producing an even harmonic mixing product at IF port 106.

The LO signal applied to the center conductor of marchand balun 196 includes broadband noise. The LO signal and associated broadband noise at port 200 is $+V_{LO}+V_{noise}$ and at port 201 is $-V_{LO}-V_{noise}$. Broadband noise associated with the LO signal at $2f_{LO}\pm f_{IF}$ is converted to the IF frequency efficiently in anti-parallel diode pairs $D_4$, $D_5$ and $D_6$, $D_7$. However, since the noise signal in diode pair $D_4$, $D_5$ is 180° out of phase from the noise signal in diode pair $D_6$, $D_7$, the noise down-converted to the IF at frequencies of $2f_{LO}\pm f_{IF}$ by the diode pairs $D_4$, $D_5$ and $D_6$, $D_7$ is 180° out of phase. These noise signals travel to nodes 202 and 203 and reach node 204, thereby cancelling each other (i.e., they are 180° out of phase). Therefore, LO broadband noise does not convert to the IF frequency and does not affect the noise figure of the spectrum analyzer.

Selecting the desired harmonic mixing product (i.e., $f_{IF}=2nf_{LO}\pm f_{RF}$) is achieved by tuning preselector 104 to an RF input signal and applying the correct LO signal to mixer 105. The only mixing product that flows to IF port 106 is the predetermined IF signal (e.g., $f_{IF}=3.9107$ GHz).

The LO signal is fed into image-enhanced, single-balanced barium-ferrite tuned mixer 105 through marchand balun 196, LO and IF diplexer 195, and the 14 GHz low-pass filter comprising capacitors $C_2$ and $C_3$ and inductors $L_1$. The return path for the LO current is through the grounded end of diodes $D_4$, $D_5$, $D_6$, and $D_7$. The RF current flows through output suspended stripline coupling 142 and mixes with the LO signal in diode bridge $D_4$, $D_5$, $D_6$, and $D_7$. Diodes $D_4$ and $D_5$ are anti-parallel with respect to the LO $(-V_{LO})$ and RF signals and therefore produce even harmonic mixing products at frequencies $2nf_{LO}\pm f_{RF}$ with respect to the direction of RF current flow. Also, diodes $D_6$ and $D_7$ are antiparallel with respect to the LO $(+V_{LO})$ and RF signals and therefore produce even harmonic mixing products at frequencies $2nf_{LO}\pm f_{RF}$.

The LO current flows through diodes $D_4$ and $D_7$ during the positive half cycle of the LO signal and through diodes $D_5$ and $D_6$ during the negative half cycle of the LO signal, which are in series with output suspended stripline coupling 142, alternately forward biasing the respective diode pairs into their conducting states. Each of the diodes $D_4$, $D_5$, $D_6$, and $D_7$ can be represented by a time-varying conductance. Conductance g(t) represents the time-dependent conductance of diodes $D_4$ and $D_7$, as driven by the positive half cycle of the LO signal. Conversely, diodes $D_5$ and $D_6$ are driven by the negative half cycle of the LO signal and are represented by g(t+T/2), where T is the period of the LO signal.

As shown in FIG. 3, the currents through diodes $D_4$, $D_5$, $D_6$, and $D_7$ are given by the following equations:

$$I_1(t) = V_{rf}(t) \cdot g(t)$$

$$I_2(t) = -V_{rf}(t) \cdot g(t+T/2)$$

$$I_3(t) = -V_{rf}(t) \cdot g(t+T/2)$$

$$I_4(t) = V_{rf}(t) \cdot g(t)$$

By performing the Fourier transforms of the above equations, one can analyze the currents at the frequencies of the LO signal, RF input signal, and all combinations of mixing products. The asterisk (*) symbol in the following equations represents a convolution function.

$$I_1(f) = V_{rf}(f) * G(f)$$

$$I_2(f) = -V_{rf}(f) * G(f)\exp(j2\pi fT/2)$$

$$I_3(f) = -V_{rf}(f) * G(f)\exp(j2\pi fT/2)$$

$$I_4(f) = V_{rf}(f) * G(f)$$

Currents $I_1(f)$, $I_2(f)$, $I_3(f)$, and $I_4(f)$ represent all possible mixing products between the LO signal and the RF input signal in the frequency domain.

Currents $I_5(f)$ and $I_6(f)$ are currents flowing out of respective diode pairs $D_4$, $D_7$ and $D_5$, $D_6$ into IF port 106 and are given by:

$$I_5(f) = I_6(f) = V_{rf}(f) * G(f)[1+\exp(j2\pi fT/2)]$$

In the case of a spectrum analyzer, in which the LO is a pure sinusoidal signal, these equations can be reduced to the following equation:

$$I_5(f) = I_6(f) = V_{rf}(f) * \sum_{n=-\infty}^{n=+\infty} G(nf_{LO})[1+\exp(jn\Pi f_{LO}T)]$$

Since $f_{LO}=1/T$, the expression $[1+\exp(jn\pi f_{LO}T)]$ reduces to the expression $[1+\exp(jn\pi)]$ which has a real part that is equal to zero when n corresponds to an odd number and equals 2 when n is even. Therefore, the immediately preceding equation can be reduced to the following equation:

$$I_5(f) = I_6(f) = 2V_{rf}(f) * \sum_{n=-\infty}^{n=+\infty} G(2nf_{LO})$$

It is evident from this last equation that the real part of the currents flowing into IF port 106 are only the even harmonics of the LO signal mixing with the RF input signal.

The odd harmonic mixing products are cancelled. Consequently, mixer 105 is a single-balanced mixer which operates as an even harmonic mixer.

The parametric values of the elements of routing circuit 102 and image-enhanced, single-balanced barium-ferrite tuned mixer 105 depend upon the frequency range over which routing barium-ferrite tuned resonator filter and mixer circuit 100 is intended to operate. In the case of one implementation of routing barium-ferrite tuned resonator filter and mixer circuit 100 intended to operate from approximately 0 to 50 GHz, the elements have the following parametric values:

Capacitors:

$C_1 = 50.0$ pf
$C_2 = 0.3$ pf
$C_3 = 0.3$ pf

Inductors:

$TL_1 = 0.1$ nh
$TL_2 = TL_3 = TL_4 = 100$ Ω, λ/4 at 10 GHz
$L_1 = 0.2$ nh
$L_2 = 0.1$ nh

Resistors:

$R_1 = R_2 = R_4 = 10$ kΩ
$R_3 = 400$ Ω

Selecting the correct mixing product is performed by tuning preselector 104 to the frequency of an RF input signal of interest and selecting the correct LO signal frequency. Referring to FIG. 3, an example of second harmonic mixing is as follows:

$f_{RF} = 29.9107$ GHz (preselector 104 is tuned to 29.9107 GHz)

$f_{LO} = 13$ GHz second harmonic mixing

| Odd harmonic mixing products (i.e., $f_{IF=(2n+1)f_{LO}} \pm f_{RF}$): | | |
|---|---|---|
| For n = 0, | | |
| 13 ± 29.9107 GHz | 16.9107 GHz | (circulating within anti-parallel diode pairs $D_4$, $D_5$ and $D_6$, $D_7$) |
| | 42.9107 GHz | (circulating within anti-parallel diode pairs $D_4$, $D_5$ and $D_6$, $D_7$) |
| For n = 1, | | |
| 39 GHz ± 29.9107 GHz | 68.9107 GHz | (circulating within anti-parallel diode pairs $D_4$, $D_5$ and $D_6$, $D_7$) |
| | 9.0893 GHz | (circulating within anti-parallel diode pairs $D_4$, $D_5$ and $D_6$, $D_7$) |
| Even harmonic mixing products (i.e., $f_{IF} = 2nf_{LO} \pm f_{RF}$): | | |
| For n = 1, | | |
| \|26 ± 29.9107\| GHz | 3.1907 GHz | (flows to IF port 106) |
| | 54.9107 GHz | (recirculated by low-pass filter $C_2$, $L_1$, $C_3$ back to diodes $D_4$, $D_5$, $D_6$, and $D_7$) |
| For n = 2, | | |
| \|52 ± 29.9107\| GHz | 81.9107 GHz | (recirculated by low-pass filter $C_2$, $L_1$, $C_3$ back to diodes $D_4$, $D_5$, $D_6$, and $D_7$) |
| | 22.0893 GHz | (recirculated by low-pass filter $C_2$, $L_1$, $C_3$ back to diodes $D_4$, $D_5$, $D_6$, and $D_7$) |

For n=3, 4, 5, ..., m, the result is the same.

In order to improve mixer conversion efficiency, a 3 to 6.8 GHz LO frequency is preferably doubled using an MMIC (Monolithic Microwave Integrated Circuit) multiplier-amplifier (not shown). The higher LO frequency allows fourth harmonic versus eighth harmonic mixing at 50 GHz. Therefore, single-balanced even harmonic mixer 105 is preferably used to down-convert signals from 26 to 50 GHz to a 3.9107 GHz IF using a 6 to 13.6 GHz local oscillator (doubled 3 to 6.8 GHz fundamental LO).

Mixer 105 comprises a dual anti-parallel pair of diodes $D_4$, $D_5$ and $D_6$, $D_7$ and is integrated with the fourth barium-ferrite sphere 140 of preselector 104. Integrating preselector 104 with mixer 105 eliminates coaxial cable between the preselector and mixer. This reduces mismatch ripple between these structures, thereby improving amplitude accuracy. At the same time, efficiency of mixer 105 is enhanced through better control of high order mixing products.

Figure 6:
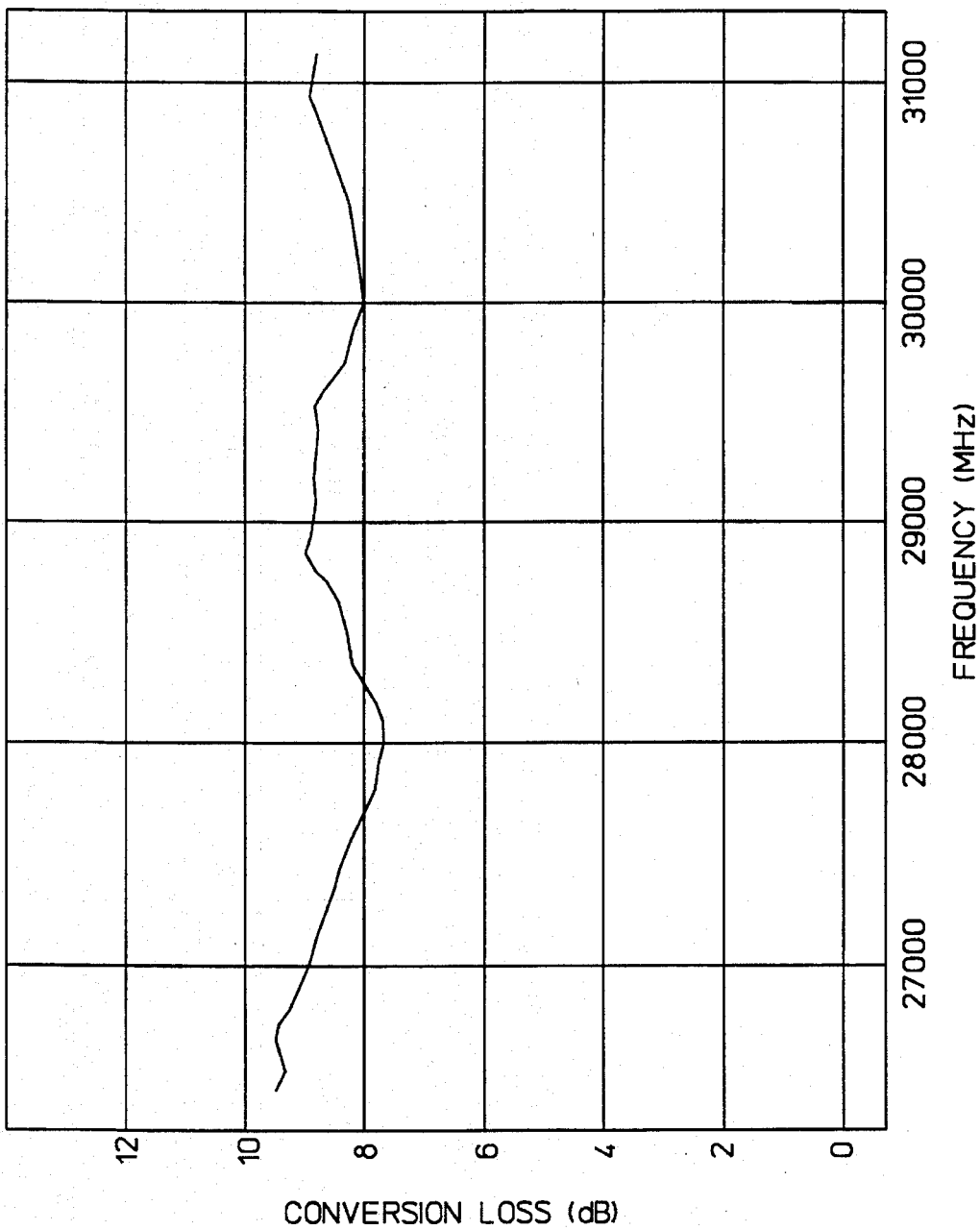
FIG. 6 illustrates conversion loss of the routing barium-ferrite tuned resonator filter and image-enhanced, single-balanced mixer circuit shown in FIG. 3 from 26 to 31 GHz.
Figure 7:
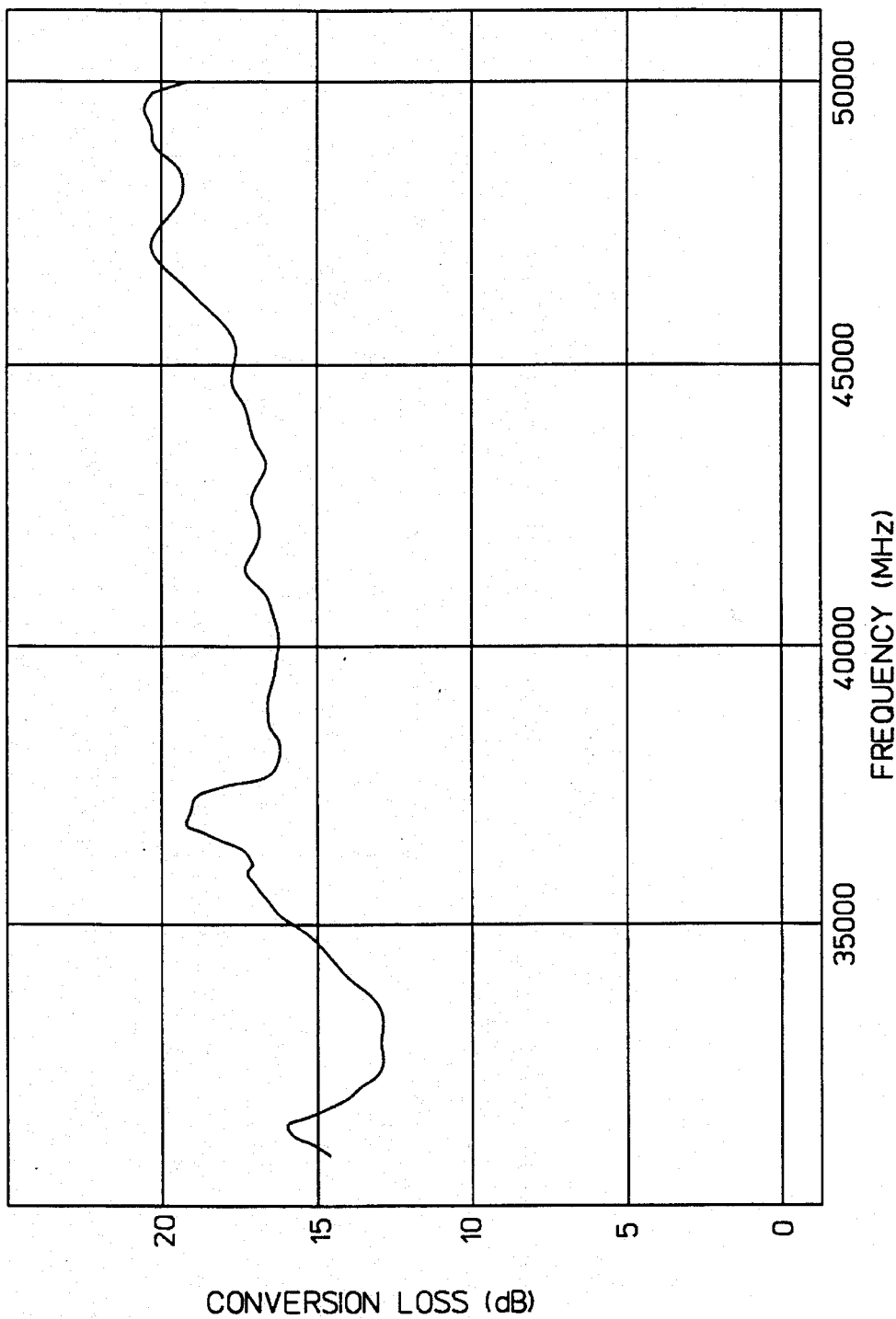
FIG. 7 illustrates conversion loss of the routing barium-ferrite tuned resonator filter and image-enhanced, single-balanced mixer circuit shown in FIG. 3 from 31 to 50 GHz.

Second harmonic mixing is used at frequencies from 26 to 31 GHz. A conversion loss of 12 dB is achieved through routing circuit 102, preselector 104, mixer 105, and IF amplifier 199 for second harmonic mixing, as shown in FIG. 6. Fourth harmonic mixing is used at frequencies from 31 to 50 GHz. A conversion loss of 20 dB is achieved for fourth harmonic mixing, as shown in FIG. 7. Two-tone distortion of the routing barium-ferrite tuned resonator filter and image-enhanced, single-balanced mixer circuit 100 has been measured from 26 GHz to 50 GHz with a third-order-intercept (TOI) typically greater than +18 dBm.

The routing barium-ferrite tuned resonator filter and image-enhanced, single-balanced mixer circuit 100 is preferably used in a portable spectrum analyzer to provide continuous sweeps from approximately 0 to 50 GHz with a low noise floor. FIG. 8 illustrates the spectrum analyzer display when sweeping the full frequency range, with a displayed average noise level of −135 dBm/Hz at 50 Hz. At 26.5 GHz, where RF input signals are first routed to preselector 104 and mixer 105, a drop in noise floor is seen. The frequency response from 20 MHz to 50 GHz achieved by routing barium-ferrite tuned resonator filter and image-enhanced, single-balanced mixer circuit 100 is illustrated in FIG. 9.

It will be understood and appreciated that the embodiments of the present invention described above are susceptible to various modifications, changes, and adaptations. For example, routing barium-ferrite tuned resonator filter and image-enhanced, single-balanced mixer circuit 100 can comprise only a single resonator, in which case barium-ferrite sphere 124 would be disposed between input and output suspended stripline couplings 126 and 142 and the other resonator structure would be eliminated. All is intended to be comprehended within the meaning and range of equivalents of the appended claims.

What is claimed is:

1. A frequency-tunable resonator filter and mixer to provide a tunable bandpass filter and image-enhanced, single-balanced mixer in response to a radio-frequency (RF) input signal having a given frequency at an RF input, comprising:

at least one frequency-tunable resonator, comprising:

an input suspended stripline coupling coupled to the RF input for receiving the RF input signal;

a ferrimagnetic sphere proximate to and magnetically coupled to the input suspended stripline coupling; and an output suspended stripline coupling proximate to and magnetically coupled to the ferrimagnetic sphere such that the RF input signal is coupled to the output suspended stripline coupling when a resonance frequency of the at least one frequency-tunable resonator approximates the given frequency of the RF input signal, the output suspended stripline coupling having a first end and a second end;

an electromagnet proximate to the at least one frequency-tunable resonator for producing a DC magnetic field that is uniform over the at least one frequency-tunable resonator for tuning the resonance frequency of the at least one frequency-tunable resonator;

a diode bridge connected to the first end of the output suspended stripline coupling;

a low-pass filter having a first end and a second end, the first end of the low-pass filter being connected to the second end of the output suspended stripline coupling;

a local oscillator (LO) and intermediate frequency (IF) diplexer having a first end, a second end, and an IF port, the first end of the LO and IF diplexer being connected to the second end of the low-pass filter;

a balun having a first end and a second end, the first end of the balun being connected to the second end of the LO and IF diplexer; and a swept LO input coupled to the second end of the balun for generating an LO signal;

wherein the diode bridge combines the RF input signal with a harmonic of the LO signal for producing an IF output signal at the IF port.

2. The frequency-tunable resonator filter and mixer in accordance with claim 1, wherein the RF input signal comprises at least one of low-frequency input signals and high-frequency input signals, further comprising a routing circuit for routing said low-frequency input signals to a low-frequency output and said high-frequency input signals to the input suspended stripline coupling, the routing circuit comprising:

a transmission line connected in series between the input suspended stripline coupling and the low-frequency output, the transmission line having a first end and a second end;

an integrated capacitor and a first diode connected in series between a junction of the input suspended stripline coupling and the first end of the transmission line, on the one hand, and ground, on the other hand;

the integrated capacitor and a second diode connected in series between a junction of the second end of the transmission line and the low-frequency output, on the one hand, and ground, on the other hand; and a bias network, comprising:

a first resistor having a first end connected to a junction of the integrated capacitor and the first diode and a second resistor having a first end connected to a second end of the first resistor and a second end connected to ground;

a third diode connected between a junction of the integrated capacitor and the second diode, on the one hand, and a first end of a third resistor, on the other hand;

a fourth resistor having a first end connected to a junction of the first and second resistors, on the one hand, and a second end connected to a junction of the third diode and the third resistor, on the other hand; and a bias voltage selectively connected to a second end of the third resistor for simultaneously biasing the first, second, and third diodes "off" to route the low-frequency input signals to the low-frequency output.

3. The frequency-tunable resonator filter and mixer in accordance with claim 2, further comprising:
  a second frequency-tunable resonator having an input coupled to the RF input and an output to provide a first stage of the filter;
  a third frequency-tunable resonator having an input coupled to the output of the second frequency-tunable resonator and an output to provide a second stage of the filter; and
  a fourth frequency-tunable resonator having an input coupled to the output of the third frequency-tunable resonator and an output to provide a third stage of the filter;
  wherein the electromagnet produces said DC magnetic field that is uniform over the frequency-tunable resonators for tuning the resonance frequency of the resonators; and
  wherein the output suspended stripline coupling of the at least one frequency-tunable resonator is coupled to the output of the fourth frequency-tunable resonator to provide a fourth stage of the filter, as well as an image-enhanced, single-balanced mixer.

4. The frequency-tunable resonator filter and mixer in accordance with claim 3, wherein:
  the input suspended stripline coupling is coupled to the input of the second frequency-tunable resonator;
  a first iris coupling couples the output of the second frequency-tunable resonator and the input of the third frequency-tunable resonator;
  a coupling loop couples the output of the third frequency-tunable resonator to the input of the fourth frequency-tunable resonator; and
  a second iris coupling couples the output of the fourth frequency-tunable resonator and the ferrimagnetic sphere of the at least one frequency-tunable resonator.

5. The frequency-tunable resonator filter and mixer in accordance with claim 1, wherein the output suspended stripline coupling comprises beam leads connected at a first end of the beam leads to the diode bridge and connected at a second end of the beam leads to the first end of the low-pass filter.

6. The frequency-tunable resonator filter and mixer in accordance with claim 5, further comprising:
  a second frequency-tunable resonator having an input coupled to the RF input and an output to provide a first stage of the filter;
  a third frequency-tunable resonator having an input coupled to the output of the second frequency-tunable resonator and an output to provide a second stage of the filter; and
  a fourth frequency-tunable resonator having an input coupled to the output of the third frequency-tunable resonator and an output to provide a third stage of the filter;
  wherein the electromagnet produces said DC magnetic field that is uniform over the frequency-tunable resonators for tuning the resonance frequency of the resonators; and
  wherein the output suspended stripline coupling of the at least one frequency-tunable resonator is coupled to the output of the fourth frequency-tunable resonator to provide a fourth stage of the filter, as well as an image-enhanced, single-balanced mixer.

7. The frequency-tunable resonator filter and mixer in accordance with claim 6, wherein:
  the input suspended stripline coupling is coupled to the input of the second frequency-tunable resonator;
  a first iris coupling couples the output of the second frequency-tunable resonator and the input of the third frequency-tunable resonator;
  a coupling loop couples the output of the third frequency-tunable resonator to the input of the fourth frequency-tunable resonator; and
  a second iris coupling couples the output of the fourth frequency-tunable resonator and the ferrimagnetic sphere of the at least one frequency-tunable resonator.

8. The frequency-tunable resonator filter and mixer in accordance with claim 1, wherein the low-pass filter comprises:
  first and second inductors having respective first ends connected to the second end of the output suspended stripline coupling and respective second ends connected to the first end of the LO and IF diplexer;
  second and third capacitors connected between respective junctions of the first ends of the first and second inductors and the second end of the output suspended stripline coupling, on the one hand, and ground, on the other hand; and
  fourth and fifth capacitors connected between respective junctions of the second ends of the first and second inductors and the first end of the LO and IF diplexer, on the one hand, and ground, on the other hand.

9. The frequency-tunable resonator filter and mixer in accordance with claim 8, further comprising:
  a second frequency-tunable resonator having an input coupled to the RF input and an output to provide a first stage of the filter;
  a third frequency-tunable resonator having an input coupled to the output of the second frequency-tunable resonator and an output to provide a second stage of the filter; and
  a fourth frequency-tunable resonator having an input coupled to the output of the third frequency-tunable resonator and an output to provide a third stage of the filter;
  wherein the electromagnet produces said DC magnetic field that is uniform over the frequency-tunable resonators for tuning the resonance frequency of the resonators; and
  wherein the output suspended stripline coupling of the at least one frequency-tunable resonator is coupled to the output of the fourth frequency-tunable resonator to provide a fourth stage of the filter, as well as an image-enhanced, single-balanced mixer.

10. The frequency-tunable resonator filter and mixer in accordance with claim 9, wherein:
  the input suspended stripline coupling is coupled to the input of the second frequency-tunable resonator;
  a first iris coupling couples the output of the second frequency-tunable resonator and the input of the third frequency-tunable resonator;
  a coupling loop couples the output of the third frequency-tunable resonator to the input of the fourth frequency-tunable resonator; and
  a second iris coupling couples the output of the fourth frequency-tunable resonator and the ferrimagnetic sphere of the at least one frequency-tunable resonator.

11. The frequency-tunable resonator filter and mixer in accordance with claim 1, wherein the balun is a march and balun, comprising:

a center conductor connected at a first end of the center conductor to the swept LO input and connected at a second end of the center conductor to a first port at the second end of the LO and IF diplexer; and an outer shield connected at a first end to ground and connected at a second end to a second port at the second end of the LO and IF diplexer.

12. The frequency-tunable resonator filter and mixer in accordance with claim 11, further comprising:

a second frequency-tunable resonator having an input coupled to the RF input and an output to provide a first stage of the filter;

a third frequency-tunable resonator having an input coupled to the output of the second frequency-tunable resonator and an output to provide a second stage of the filter; and a fourth frequency-tunable resonator having an input coupled to the output of the third frequency-tunable resonator and an output to provide a third stage of the filter;

wherein the electromagnet produces said DC magnetic field that is uniform over the frequency-tunable resonators for tuning the resonance frequency of the resonators; and wherein the output suspended stripline coupling of the at least one frequency-tunable resonator is coupled to the output of the fourth frequency-tunable resonator to provide a fourth stage of the filter, as well as an image-enhanced, single-balanced mixer.

13. The frequency-tunable resonator filter and mixer in accordance with claim 12, wherein:

the input suspended stripline coupling is coupled to the input of the second frequency-tunable resonator;

a first iris coupling couples the output of the second frequency-tunable resonator and the input of the third frequency-tunable resonator;

a coupling loop couples the output of the third frequency-tunable resonator to the input of the fourth frequency-tunable resonator; and a second iris coupling couples the output of the fourth frequency-tunable resonator and the ferrimagnetic sphere of the at least one frequency-tunable resonator.

14. The frequency-tunable resonator filter and mixer in accordance with claim 5, wherein the LO and IF diplexer comprises:

a second transmission line and an inductor connected between the first port of the LO and IF diplexer and ground;

a first node coupled to the first port of the LO and IF diplexer and connected in series with a third transmission line to a second node;

a third node coupled to the second port of the LO and IF diplexer and connected in series with a fourth transmission line to the second node;

the first and third nodes of the LO and IF diplexer being coupled to the second end of the low-pass filter; and the second node of the LO and IF diplexer being coupled to the IF port;

wherein broadband LO noise is eliminated.

15. The frequency-tunable resonator filter and mixer in accordance with claim 14, further comprising:

a second frequency-tunable resonator having an input coupled to the RF input and an output to provide a first stage of the filter;

a third frequency-tunable resonator having an input coupled to the output of the second frequency-tunable resonator and an output to provide a second stage of the filter; and a fourth frequency-tunable resonator having an input coupled to the output of the third frequency-tunable resonator and an output to provide a third stage of the filter;

wherein the electromagnet produces said DC magnetic field that is uniform over the frequency-tunable resonators for tuning the resonance frequency of the resonators; and wherein the output suspended stripline coupling of the at least one frequency-tunable resonator is coupled to the output of the fourth frequency-tunable resonator to provide a fourth stage of the filter, as well as an image-enhanced, single-balanced mixer.

16. The frequency-tunable resonator filter and mixer in accordance with claim 15, wherein:

the input suspended stripline coupling is coupled to the input of the second frequency-tunable resonator;

a first iris coupling couples the output of the second frequency-tunable resonator and the input of the third frequency-tunable resonator;

a coupling loop couples the output of the third frequency-tunable resonator to the input of the fourth frequency-tunable resonator; and a second iris coupling couples the output of the fourth frequency-tunable resonator and the ferrimagnetic sphere of the at least one frequency-tunable resonator.

17. The frequency-tunable resonator filter and mixer in accordance with claim 14, wherein the second node of the LO and IF diplexer is coupled to an input of an IF amplifier and an output of the IF amplifier is connected to the IF port.

18. The frequency-tunable resonator filter and mixer in accordance with claim 17, further comprising:

a second frequency-tunable resonator having an input coupled to the RF input and an output to provide a first stage of the filter;

a third frequency-tunable resonator having an input coupled to the output of the second frequency-tunable resonator and an output to provide a second stage of the filter; and a fourth frequency-tunable resonator having an input coupled to the output of the third frequency-tunable resonator and an output to provide a third stage of the filter;

wherein the electromagnet produces said DC magnetic field that is uniform over the frequency-tunable resonators for tuning the resonance frequency of the resonators; and wherein the output suspended stripline coupling of the at least one frequency-tunable resonator is coupled to the output of the fourth frequency-tunable resonator to provide a fourth stage of the filter, as well as an image-enhanced, single-balanced mixer.

19. The frequency-tunable resonator filter and mixer in accordance with claim 1, further comprising:

a second frequency-tunable resonator having an input coupled to the RF input and an output to provide a first stage of the filter;

a third frequency-tunable resonator having an input coupled to the output of the second frequency-tunable resonator and an output to provide a second stage of the filter; and a fourth frequency-tunable resonator having an input coupled to the output of the third frequency-tunable resonator and an output to provide a third stage of the filter;

wherein the electromagnet produces said DC magnetic field that is uniform over the frequency-tunable resonators for tuning the resonance frequency of the resonators; and wherein the output suspended stripline coupling of the at least one frequency-tunable resonator is coupled to the output of the fourth frequency-tunable resonator to provide a fourth stage of the filter, as well as an image-enhanced, single-balanced mixer.

20. The frequency-tunable resonator filter and mixer in accordance with claim 19, wherein:

the input suspended stripline coupling is coupled to the input of the second frequency-tunable resonator;

a first iris coupling couples the output of the second frequency-tunable resonator and the input of the third frequency-tunable resonator;

a coupling loop couples the output of the third frequency-tunable resonator to the input of the fourth frequency-tunable resonator; and a second iris coupling couples the output of the fourth frequency-tunable resonator and the ferrimagnetic sphere of the at least one frequency-tunable resonator.

* * * * *